US012615712B2

(12) United States Patent (10) Patent No.: US 12,615,712 B2
Kobayashi et al. (45) Date of Patent: Apr. 28, 2026

(54) WIRING SUBSTRATE

(71) Applicant: SHINKO ELECTRIC INDUSTRIES CO., LTD., Nagano (JP)

(72) Inventors: Yuki Kobayashi, Nagano (JP); Tomoo Yamasaki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 227 days.

(21) Appl. No.: 18/614,865

(22) Filed: Mar. 25, 2024

(65) Prior Publication Data

US 2024/0334598 A1 Oct. 3, 2024

(30) Foreign Application Priority Data

Mar. 28, 2023 (JP) ................................. 2023-052050

(51) Int. Cl.
H05K 1/09 (2006.01)
H05K 1/03 (2006.01)
H05K 1/11 (2006.01)
H05K 3/10 (2006.01)

(52) U.S. Cl.
CPC ............. H05K 1/09 (2013.01); H05K 1/0373 (2013.01); H05K 1/113 (2013.01); H05K 3/108 (2013.01); H05K 2201/0209 (2013.01); H05K 2201/0338 (2013.01); H05K 2203/072 (2013.01); H05K 2203/0723 (2013.01)

(58) Field of Classification Search
CPC ........ H05K 1/09; H05K 1/0373; H05K 1/113; H05K 2201/0209; H05K 2201/0338
See application file for complete search history.

(56) References Cited

U.S. PATENT DOCUMENTS

2010/0126758 A1* 5/2010 Akai ...................... H05K 3/389
174/257

FOREIGN PATENT DOCUMENTS

JP 2020188139 A 11/2020

* cited by examiner

*Primary Examiner* — Sherman Ng
(74) *Attorney, Agent, or Firm* — Tarolli, Sundheim, Covell & Tummino LLP

(57) ABSTRACT

A wiring substrate includes a first wiring layer, an insulation layer covering a side surface of the first wiring layer and exposing part of the first wiring layer, and a second wiring layer formed on the first wiring layer exposed from the insulation layer. The insulation layer includes a resin and a filler. The insulation layer includes an upper surface having a structure in which the filler is exposed from the resin. The second wiring layer includes a first metal film, covering the upper surface of the insulation layer and the wiring layer exposed from the insulation layer, and a metal layer, formed above the first metal film. The first metal film is formed from a CuNiTi alloy and has a Ni content rate of 5 wt % or greater and 30 wt % or less and a Ti content rate of 5 wt % or greater and 15 wt % or less.

9 Claims, 16 Drawing Sheets

Fig.12

| Ti Content Rate (wt%) | Ni Content Rate (wt%) | | | | | | |
|---|---|---|---|---|---|---|---|
| | 0 | 5 | 10 | 20 | 30 | 40 |
| 0 | × | × | × | × | × | × |
| 5 | × | ○ | ○ | ○ | ○ | ○ |
| 10 | × | ○ | ○ | ○ | ○ | ○ |
| 15 | × | ○ | ○ | ○ | ○ | ○ |
| 20 | ○ | ○ | ○ | ○ | ○ | ○ |

Fig.13

| Ti Content Rate (wt%) | Ni Content Rate (wt%) | | | | | |
|---|---|---|---|---|---|---|
| | 0 | 5 | 10 | 20 | 30 | 40 |
| 0 | O | O | O | O | O | O |
| 5 | O | O | O | O | O | X |
| 10 | O | O | O | O | O | X |
| 15 | O | O | O | O | O | X |
| 20 | X | X | X | X | X | X |

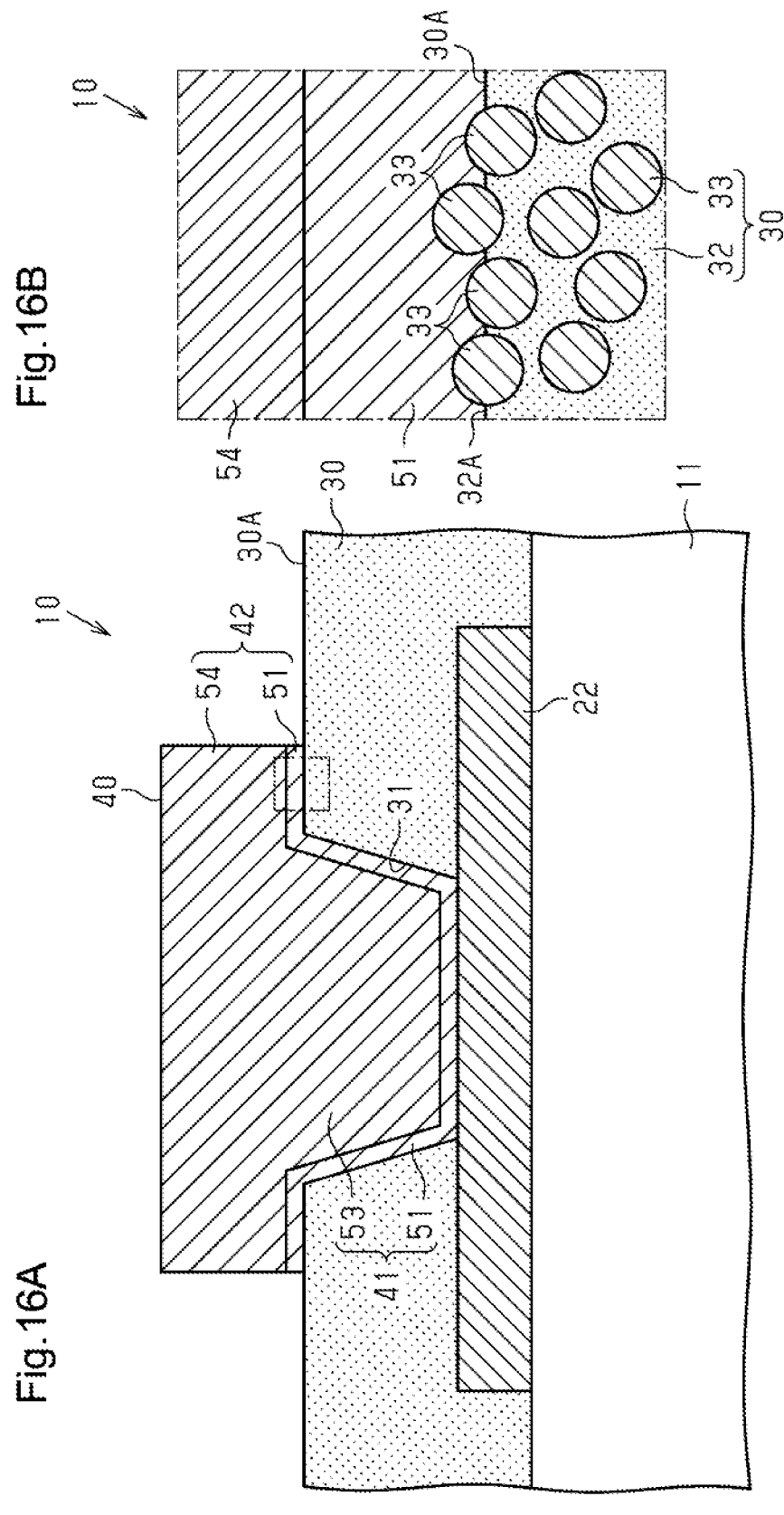

WIRING SUBSTRATE

CROSS-REFERENCE TO RELATED APPLICATIONS

This application is based upon and claims the benefit of priority from prior Japanese Patent Application No. 2023-052050, filed on Mar. 28, 2023, the entire contents of which are incorporated herein by reference.

FIELD

This disclosure relates to a wiring substrate and a method for manufacturing a wiring substrate.

BACKGROUND

Wiring substrates for mounting electronic components such as semiconductor elements have various shapes and structures. Japanese Laid-Open Patent Publication No. 2020-188139 describes a wiring substrate manufactured through a build-up process that alternately stacks wiring layers and insulation layers. The wiring layers are electrically connected to one another by via wiring formed in through holes extending through the insulation layers in a thickness-wise direction.

The insulation layers of the wiring substrate may include a resin and a filler. In this case, when the filler is exposed from the surface of an insulation layer, the adhesion decreases between the insulation layer and the wiring layer.

SUMMARY

This Summary is provided to introduce a selection of concepts in a simplified form that are further described below in the Description of the Embodiments. This Summary is not intended to identify key features or essential features of the claimed subject matter, nor is it intended to be used as an aid in determining the scope of the claimed subject matter.

In one general aspect, a wiring substrate includes a first wiring layer, an insulation layer covering a side surface of the first wiring layer and exposing at least part of an upper surface of the first wiring layer, and a second wiring layer formed on the first wiring layer that is exposed from the insulation layer. The insulation layer includes a resin and a filler. The insulation layer includes an upper surface having a structure in which the filler is exposed from the resin. The second wiring layer includes a first metal film and a metal layer. The first metal film covers the upper surface of the insulation layer and the upper surface of the wiring layer that is exposed from the insulation layer. The metal layer is formed above the first metal film. The first metal film is formed from a CuNiTi alloy. A content rate of Ni in the first metal film is 5 wt % or greater and 30 wt % or less, and a content rate of Ti in the first metal film is 5 wt % or greater and 15 wt % or less.

Other features and aspects will be apparent from the following detailed description, the drawings, and the claims.

BRIEF DESCRIPTION OF THE DRAWINGS

The embodiments, together with objects and advantages thereof, may best be understood by reference to the following description of the presently preferred embodiments together with the accompanying drawings.

FIG. 12 is a table illustrating the results of a first experiment.

FIG. 13 is a table illustrating the results of a second experiment.

FIG. 16A is an enlarged cross-sectional view of part of the wiring substrate in accordance with another modified embodiment.

FIG. 16B is a further enlarged cross-sectional view of part of the wiring substrate illustrated in FIG. 16A.

DESCRIPTION OF THE EMBODIMENTS

Figure 1:
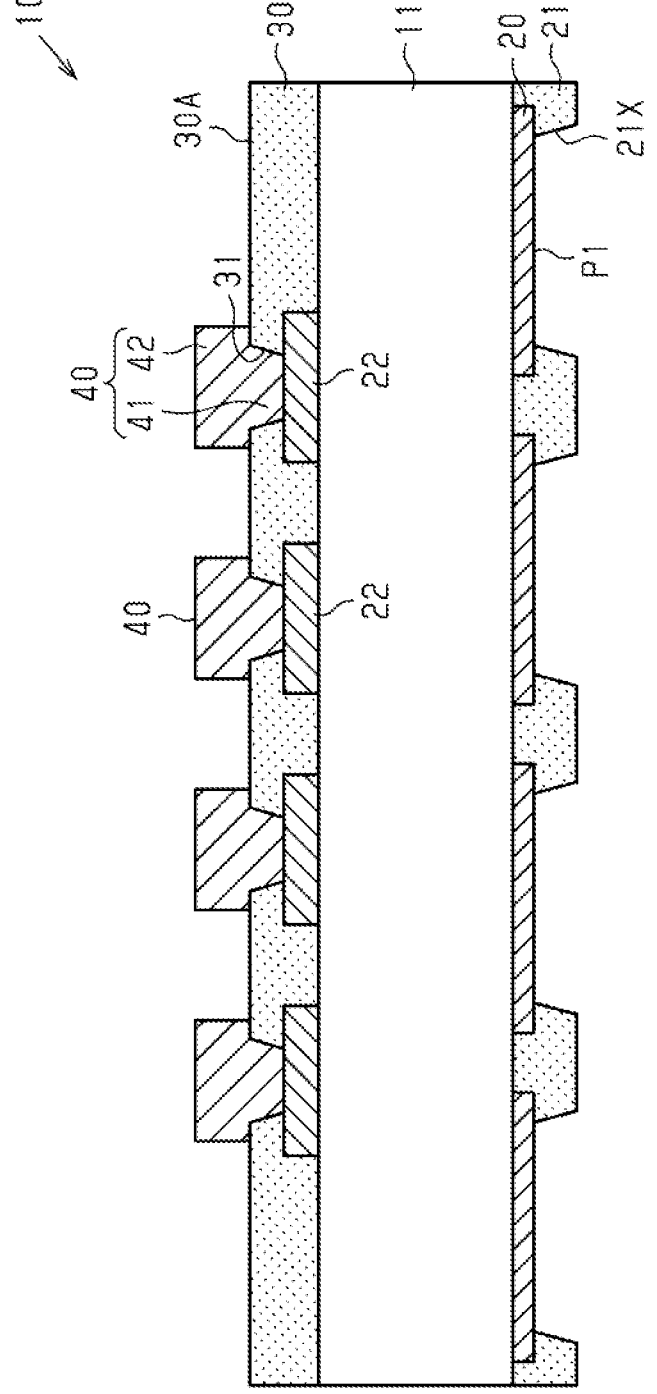
FIG. 1 is a schematic cross-sectional view of a wiring substrate in accordance with one embodiment.

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

One embodiment will now be described with reference to the drawings.

In the drawings, elements are illustrated for simplicity and clarity and have not necessarily been drawn to scale. To facilitate understanding, hatching lines may be replaced by shadings or not be illustrated in the cross-sectional views. In this specification, a plan view refers to a view of a subject taken in a vertical direction (e.g., vertical direction as viewed in FIG. 1), and a planar shape refers to a shape of a subject as viewed in the vertical direction. Further, in this specification, upward, downward, leftward, and rightward directions refer to directions that allow for the reference characters denoting members to be read properly.

Configuration of Entire Wiring Substrate 10

As illustrated in FIG. 1, a wiring substrate 10 includes a substrate body 11. A wiring layer 20 and a solder resist layer 21 are sequentially stacked on the lower surface of the substrate body 11. A wiring layer 22, an insulation layer 30, and a wiring layer 40 are sequentially stacked on the upper surface of the substrate body 11.

A wiring structure of alternately stacked insulative resin layers and wiring layers may be used as the substrate body 11. The wiring structure, for example, may include a core substrate but does not have to include a core substrate. The material of the insulative resin layers may be, for example, an insulative thermosetting resin. The insulative thermosetting resin may be an insulative resin such as an epoxy resin, a polyimide resin, or a cyanate resin. The material of the insulative resin layers may also be, for example, an insulative resin of which the main component is a photosensitive resin such as a phenolic resin or a polyimide resin. The insulative resin layers may include, for example, a filler of silica or alumina.

Copper (Cu) or a copper alloy, for example, may be used as the material of the wiring layers of the substrate body 11 and as the material of the wiring layer 20. The material of the solder resist layer 21 may be, for example, an insulative resin of which the main component is a photosensitive resin such as a phenolic resin or a polyimide resin. The solder resist layer 21 may include, for example, a filler of silica or alumina.

Structure of Wiring Layer 20

The wiring layer 20 is formed on the lower surface of the substrate body 11. The wiring layer 20 is the outermost wiring layer (here, lowermost wiring layer) of the wiring substrate 10.

Structure of Solder Resist Layer 21

The solder resist layer 21, which is formed on the lower surface of the substrate body 11, covers the wiring layer 20. The solder resist layer 21 is the outermost insulation layer (here, lowermost insulation layer) of the wiring substrate 10.

The solder resist layer 21 includes openings 21X exposing parts of the lower surface of the wiring layer 20 as external connection pads P1. The external connection pads P1 are connected to external connection terminals (not illustrated) used when mounting the wiring substrate 10 on a mounting substrate such as a motherboard.

A surface-processed layer is formed, if necessary, on the lower surface of the wiring layer 20 exposed at the bottom of each opening 21X. Examples of the surface-processed layer includes a gold (Au) layer, a nickel (Ni) layer/Au layer (metal layer in which Ni layer serves as bottom layer, and Au layer is formed on Ni layer), Ni layer/palladium (Pd) layer/ Au layer (metal layer in which Ni layer serves as bottom layer, and Ni layer and Pd layer are sequentially formed on Au layer). Further examples of the surface-processed layer include Ni layer/Pd layer (metal layer in which Ni layer serves as bottom layer, and Pd layer is formed on Ni layer), Pd layer/Au layer (metal layer in which Pd layer serves as bottom layer, and Au layer is formed on Pd layer). An Au layer is a metal layer formed from Au or an Au alloy, an Ni layer is a metal layer formed from Ni or an Ni alloy, and a Pd layer is a metal layer formed from Pd or a Pd alloy. The Au layer, Ni layer, and Pd layer may be, for example, a metal layer formed through an electroless plating process (electroless plating layer) or a metal layer formed through an electrolytic plating process (electrolytic plating layer). Further, the surface-processed layer may be an organic solderability preservative (OSP) film formed by performing an oxidation-resisting process on the lower surface of the wiring layer 20 exposed from the openings 21X. The OSP film may be an organic coating of an azole compound or an imidazole compound. When a surface-processed layer is formed on the lower surface of the wiring layer 20, the surface-processed layer functions as the external connection pads P1.

In the present example, external connection terminals are arranged on the lower surface of the wiring layer 20. Instead, the wiring layer 20 exposed at the bottom of the openings 21X may be used as the external connection terminals. Alternatively, when a surface-processed layer is formed on the lower surface of the wiring layer 20, the surface-processed layer may be used as the external connection terminals.

Structure of Wiring Layer 22

The wiring layer 22 is formed on the upper surface of the substrate body 11. The wiring layer 22 is electrically connected to the wiring layer 20 by, for example, wiring layers and through-electrodes (not illustrated) formed in the substrate body 11.

Structure of Insulation Layer 30

The insulation layer 30, which is stacked on the upper surface of the substrate body 11, covers the side surfaces of the wiring layer 22 and exposes parts of the upper surface of the wiring layer 22. The insulation layer 30 is the outermost insulation layer (here, uppermost insulation layer) of the wiring substrate 10. The insulation layer 30 may be, for example, the same as the insulation resin layers used in the substrate body 11. The insulation layer 30 may be, for example, a solder resist layer. The solder resist layer may be formed from, for example, the same material as the solder resist layer 21. The insulation layer 30 has a thickness from the upper surface of the wiring layer 22 to an upper surface 30A of the insulation layer 30 of, for example, approximately 3 μm to 30 μm.

The insulation layer 30 includes through holes 31 extending through the insulation layer 30 in the thickness-wise direction and exposing parts of the upper surface of the wiring layer 22. The through holes 31 may have any planar shape and any size. In the present example, the through holes 31 are circular in plan view. The through holes 31 have a depth of, for example, approximately 3 μm to 30 μm.

Figure 2:
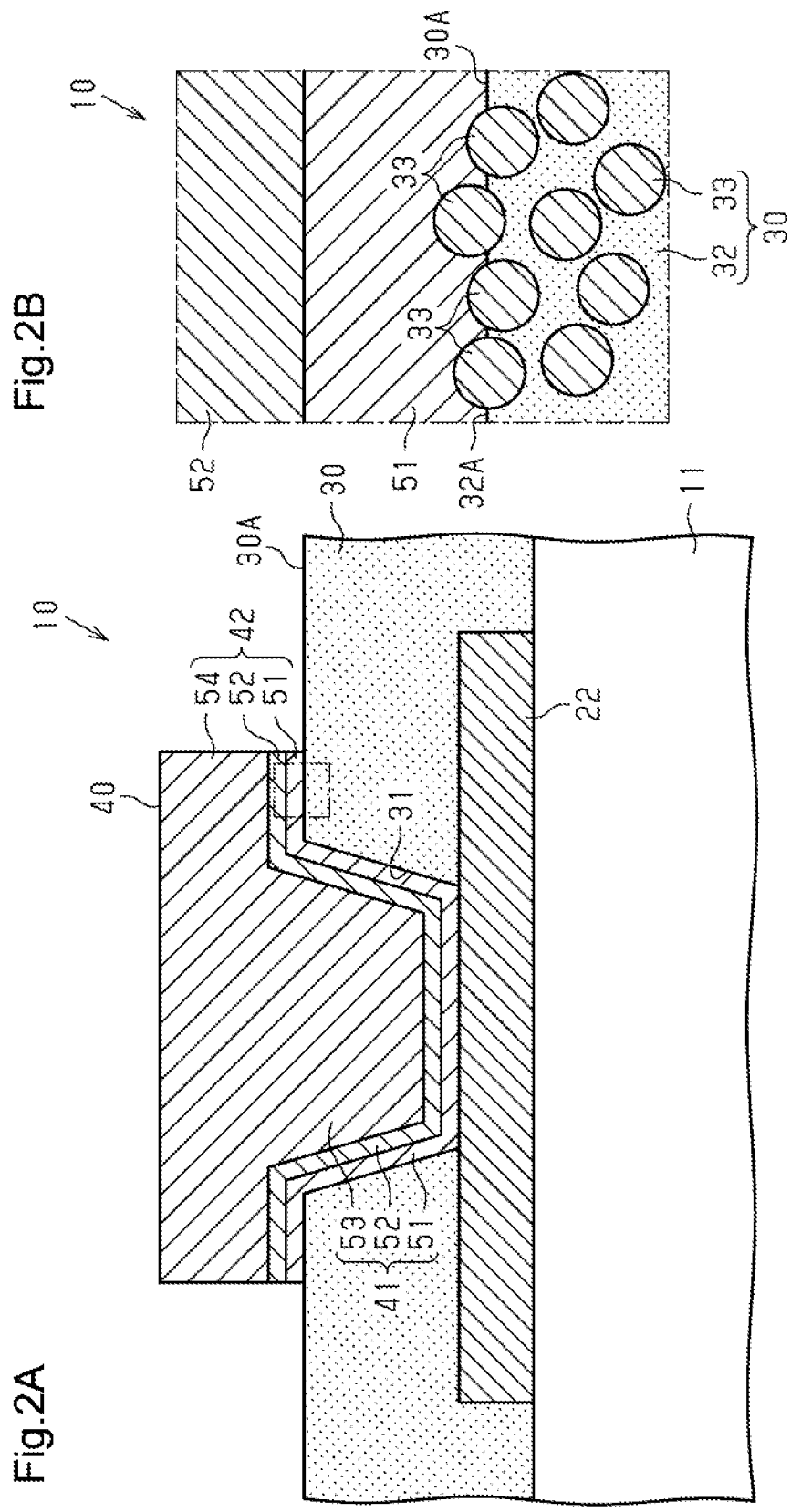
FIG. 2A is an enlarged cross-sectional view of part of the wiring substrate illustrated in FIG. 1.
FIG. 2B is a further enlarged cross-sectional view of part of the wiring substrate illustrated in FIG. 2A.

As illustrated in FIG. 2A, in the present example, each through hole 31 is tapered so that an opening width (opening diameter) decreases from the upper side (upper surface 30A of insulation layer 30) toward the lower side as viewed in FIG. 2A. The wall surface of each through hole 31 is, for example, inclined from the upper surface 30A of the insulation layer 30 so that the center of the through hole 31 becomes closer toward the wiring layer 22. The wall surface of the through hole 31 does not have to be straight. The wall surface of the through hole 31 may be partially or entirely curved outward or curved inward. The through holes 31 are, for example, via holes formed through laser drilling.

As illustrated in FIG. 2B, the insulation layer 30 includes a resin 32 and many fillers 33. The resin 32 covers, for example, the surfaces of the fillers 33. The fillers 33 are, for example, embedded in the resin 32. The resin 32 may be, for example, an insulative resin of which the main component is a thermosetting resin such as an epoxy resin, a polyimide resin, or a cyanate resin. In the present embodiment, the resin 32 is an epoxy resin. The fillers 33 may be, for example, silica fillers or alumina fillers. In the present embodiment, the fillers 33 are silica fillers. The fillers 33 are, for example, spherical.

The surface of the insulation layer 30, namely, the upper surface 30A of the insulation layer 30, is structured so that the resin 32 and the fillers 33 are arranged in a mixed state. The upper surface 30A of the insulation layer 30 is structured so that the fillers 33 are exposed from an upper surface 32A of the resin 32. In the present example, the upper surface 30A of the insulation layer 30 is structured so that parts (upper parts) of the fillers 33 project upward out of the upper surface 32A of the resin 32. In the present example, the spherical fillers 33 are partially exposed from the resin 32. Thus, in the present example, the upper surface 30A of the insulation layer 30 is structured so that parts of the spherical surfaces of the fillers 33 project upward out of the upper surface 32A of the resin 32. The fillers 33 located at the upper surface 30A of the insulation layer 30 each include a part (lower part) embedded in the resin 32 and a remaining part (upper part) exposed from the resin 32. Although FIG. 2B illustrates the structure of the upper surface 30A of the insulation layer 30, the other surfaces of the insulation layer 30, for example, the wall surfaces of the through holes 31 (refer to FIG. 2A) are also structured in the same manner as the upper surface 30A. That is, the inner wall of the through hole 31 illustrated in FIG. 2A is structured so that the fillers 33 are exposed from the surface of the resin 32.

Structure of Wiring Layer 40

As illustrated in FIG. 1, the wiring layer 40 is formed on the wiring layer 22 that is exposed in the through holes 31. The wiring layer 40 is, for example, the outermost wiring (here, uppermost wiring layer) of the wiring substrate 10. The wiring layer 40 functions as, for example, an electronic component mounting pad electrically connected to an electronic component. The wiring layer 40 includes, for example, via wiring 41, which is formed in the through holes 31, and a wiring pattern 42, which is electrically connected by the via wiring 41 to the wiring layer 22 and formed on the upper surface 30A of the insulation layer 30. The wiring layer 40 may have any shape and any size in plan view. In the present example, the wiring layer 40 is circular in plan view.

The via wiring 41, for example, fills the through holes 31. The via wiring 41 and the through holes 31 are similar in shape. The wiring pattern 42 is, for example, cylindrical and projects upward from the upper surface 30A of the insulation layer 30.

As illustrated in FIG. 2A, the wiring layer 40 includes a first metal film 51, which covers the wall surfaces of the through holes 31 and the upper surface 30A of the insulation layer 30, and a second metal film 52, which covers the surface of the first metal film 51. The wiring layer 40 includes a metal layer 53, which is formed on the second metal film 52 and which fills the through holes 31, and a metal layer 54, which is formed on the second metal film 52 at the upper surface 30A of the insulation layer 30 and on the metal layer 53. The first metal film 51 and the second metal film 52 are seed layers. The second metal film 52 is formed from, for example, Cu.

The first metal film 51 continuously covers the upper surface 30A of the insulation layer 30, the entire wall surface of each through hole 31, and the entire upper surface of the wiring layer 22 exposed at the bottom of each through hole 31. As illustrated in FIG. 2B, the first metal film 51 covers the surface of the insulation layer 30 where the fillers 33 are exposed from the resin 32. The first metal film 51, for example, entirely covers the surfaces of the fillers 33 exposed from the resin 32. The first metal film 51, for example, entirely covers the surfaces of the fillers 33 exposed from the resin 32 in an adhered state. Further, the first metal film 51 covers the surface of the resin 32 (in FIG. 2B, upper surface 32A) in an adhered state.

The first metal film 51 is formed from an alloy of Cu, nickel (Ni), and titanium (Ti), namely, a CuNiTi alloy. The Ni included in the first metal film 51 allows for higher adhesion to the resin 32 than Cu. The Ti included in the first metal film 51 allows for higher adhesion to the fillers 33 than Cu.

The content rate of Ni in the first metal film 51 is set in a range from 5 wt % or greater to 30 wt % or less. The content rate of Ti in the first metal film 51 is set in a range from 5 wt % or greater to 15 wt % or less. The content amount of Cu in the first metal film 51 is the remainder when excluding Ti and Ni from the first metal film 51. The content amount of Cu includes impurities obtained when the material is produced.

The content rate of Ni and Ti in the first metal film 51 is set in the above-described range to increase adhesion of the first metal film 51 to the surface of the insulation layer 30, where the fillers 33 are exposed from the resin 32. Further, the content rate of Ni and Ti in the first metal film 51 is set in the above-described range so that when the second metal film 52, which is a Cu film, is etched to remove unnecessary parts, unnecessary parts of the first metal film 51 are also etched and removed together with the unnecessary parts of the second metal film 52. In this manner, the content rate of Ni and Ti in the first metal film 51 is set in the above-described range to remove unnecessary parts of the first metal film 51 with a Cu etching liquid. As indicated in experiment results that will be described later, a content rate of Ti in the first metal film 51 that is less than 5 wt % decreases the adhesion of the first metal film 51 to the surface of the insulation layer 30 where the fillers 33 are exposed from the resin 32. Further, a content rate of Ti in the first metal film 51 that is greater than 15 wt % leaves residues when the first metal film 51 is etched and removed together with the Cu film. A content rate of Ni in the first metal film 51 that is less than 5 wt % decreases the adhesion of the first metal film 51 to the surface of the insulation layer 30 where the fillers 33 are exposed from the resin 32.

The first metal film 51 is, for example, a sputtered film formed through a sputtering process. The first metal film 51 may have a thickness of, for example, approximately 30 nm to 100 nm.

As illustrated in FIG. 2A, the second metal film 52 continuously covers the upper surface of the first metal film 51 at the part covering the upper surface 30A of the insulation layer 30, the side surface of the first metal film 51 at the part covering the wall surface of the through hole 31, and the upper surface of the first metal film 51 at the part covering the upper surface of the wiring layer 22. The second metal film 52 exposes the outer side surface of the first metal film 51 at the part covering the upper surface 30A of the insulation layer 30.

The second metal film 52 is a Cu film formed from Cu. The second metal film 52 is, for example, a sputtered film formed through a sputtering process. The second metal film 52 may have a thickness of, for example, approximately 300 nm to 500 nm.

The metal layer 53 is formed on the second metal film 52 and fills, for example, the through hole 31. The material of the metal layer 53 may be, for example, Cu or a Cu alloy. The metal layer 53 may be, for example, an electrolytic plating layer formed through an electrolytic plating process. In one example, the metal layer 53 is an electrolytic Cu plating layer formed through an electrolytic Cu plating process.

The via wiring 41 of the wiring layer 40 is formed in the through holes 31 by the first metal film 51, the second metal film 52, and the metal layer 53.

The metal layer 54 is formed on the second metal film 52, which is formed on the upper surface 30A of the insulation layer 30, and the via wiring 41 (metal layer 53). The metal layer 54 is formed continuously and integrally with the metal layer 53. The material of the metal layer 54 may be, for example, Cu or a Cu alloy. The metal layer 54 may be, for example, an electrolytic plating layer formed through an electrolytic plating process. In the present embodiment, the metal layer 54 is an electrolytic Cu plating layer formed through an electrolytic Cu plating process.

The metal layer 54 is, for example, cylindrical and projects upward from the upper surface 30A of the insulation layer 30. The upper surface of the metal layer 54 is, for example, flat. The metal layer 54 may have any planar shape and any size. The metal layer 54 is, for example, circular in plan view and has a diameter of approximately 15 μm to 40 μm. The metal layer 54 may have a thickness of, for example, approximately 2 μm to 50 μm.

The metal layer 54 and the first and second metal films 51 and 52 on the upper surface 30A of the insulation layer 30 form the wiring pattern 42 of the wiring layer 40.

The wiring substrate 10 may be reversed upside-down or arranged at any angle.

Method for Manufacturing Wiring Substrate 10

A method for manufacturing the wiring substrate 10 will now be described with reference to FIGS. 3 to 11. A method for manufacturing the insulation layer 30 and the wiring layer 40 will be described in detail. To simplify illustration, elements that will consequently become final elements of the wiring substrate 10 are given the same reference characters as the final elements.

Figure 3:
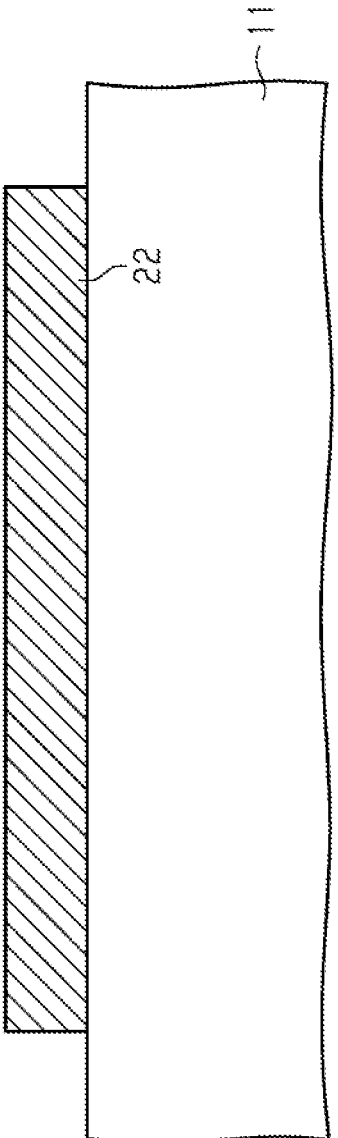
FIGS. 3, 4, 5A, 5B, 6A, 6B, 7, 8, 9, 10, and 11 are schematic cross-sectional views illustrating a method for manufacturing the wiring substrate of FIG. 1.

First, as illustrated in FIG. 3, a structure with the wiring layer 22 formed on the upper surface of the substrate body 11 is prepared. The wiring layer 22 may be formed, for example, through various wiring forming processes such as a subtractive process and a semi-additive process.

Figure 4:
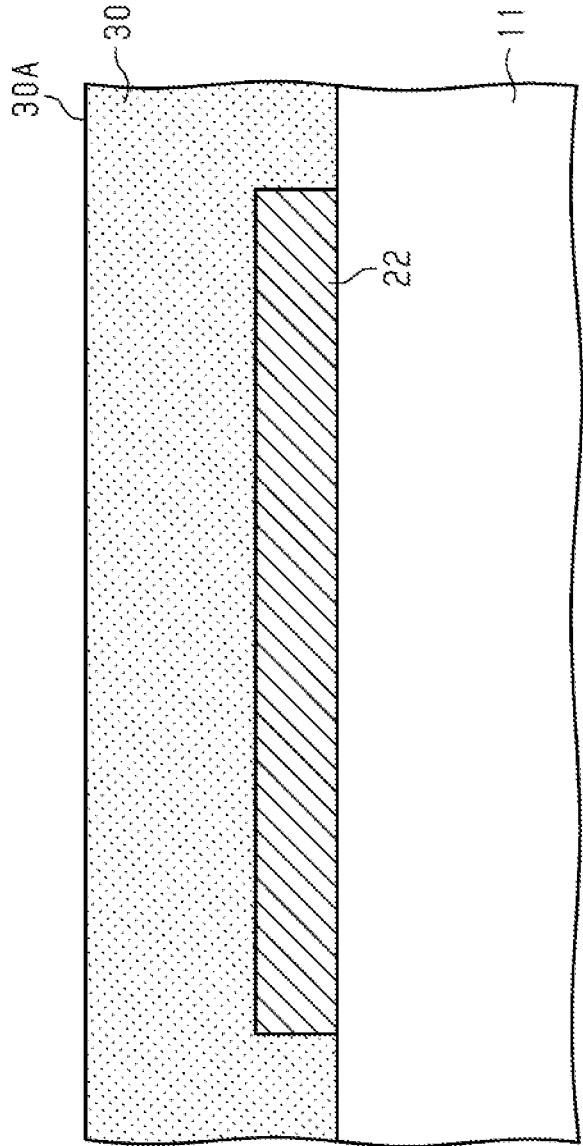
Figure 5:
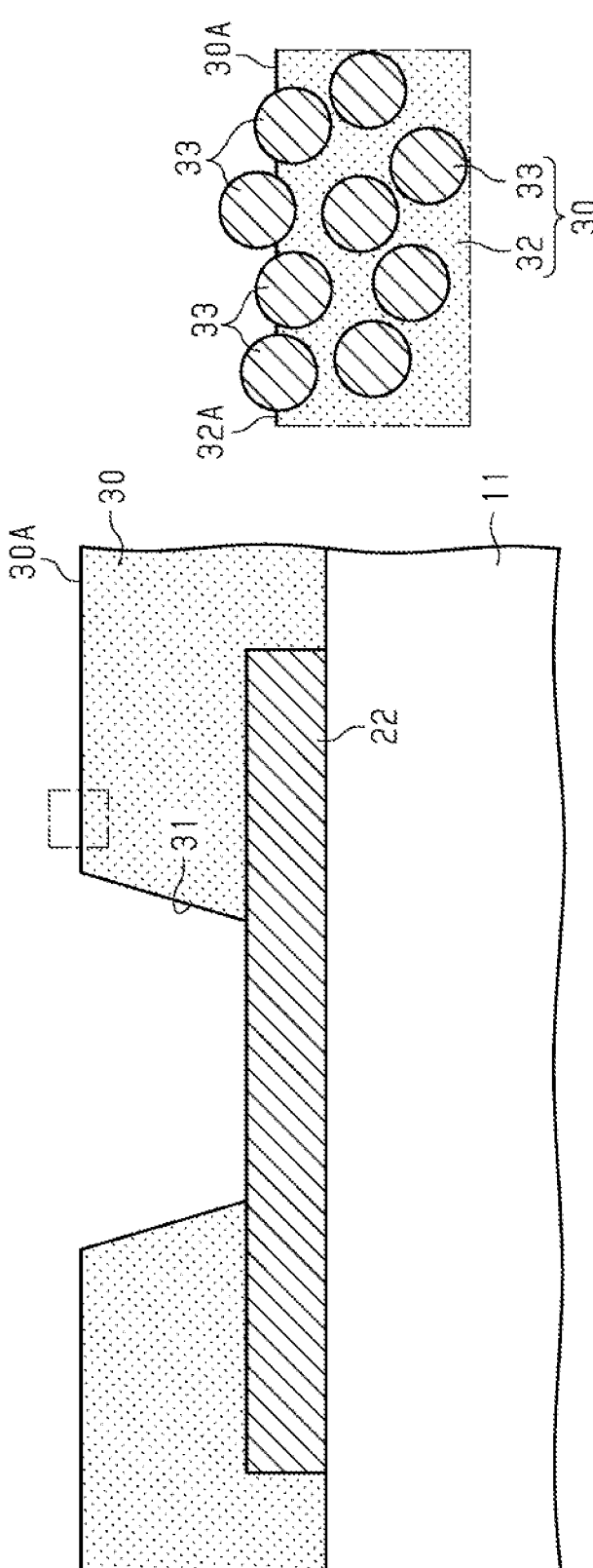
Figure 6:
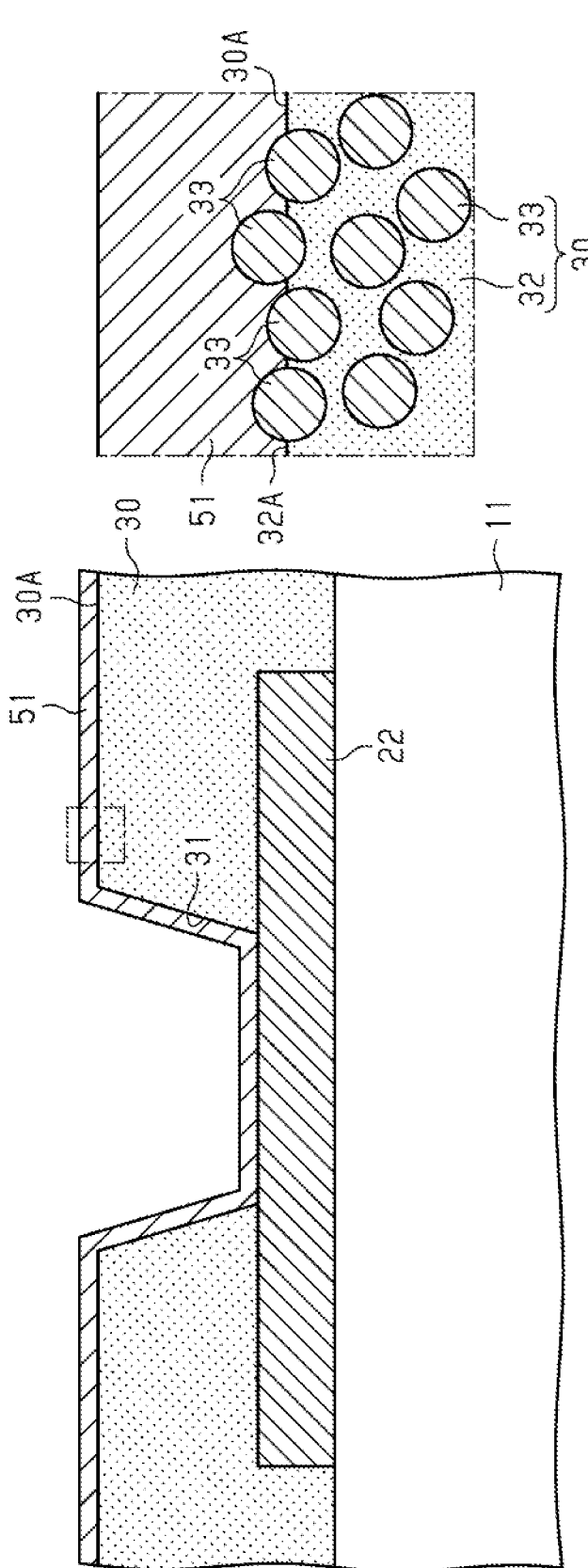

In the step illustrated in FIG. 4, the insulation layer 30, which entirely covers the wiring layer 22, is formed on the upper surface of the main substrate body 11. For example, when a resin film is used as the insulation layer 30, the resin film is laminated on the upper surface of the substrate body 11. While pressing the resin film, the resin film is heated and cured at a temperature of, for example, approximately 130° C. to 200° C. that is higher than or equal to the curing temperature to form the insulation layer 30. The resin film may be, for example, a film of a thermosetting resin of which the main component is an epoxy resin. When a liquid or paste of an insulative resin is used as the insulation layer 30, the liquid or paste of insulative resin is applied to the upper surface of the substrate body 11 through a spin coating process or the like. The applied insulative resin is heated at temperature that is greater than or equal to the curing temperature to form the insulation layer 30. The liquid or paste of insulative resin may be, for example, a thermosetting resin of which the main component is an epoxy resin.

In the step illustrated in FIG. 5A, the through holes 31, which extend through the insulation layer 30 in the thickness-wise direction and expose parts of the upper surface of the wiring layer 22, are formed in the insulation layer 30. The through holes 31 may be formed, for example, through laser drilling using a CO$_2$ laser or a UV-YAG laser.

Then, a dry desmearing process is performed to remove resin smears (resin residue) from the upper surface of the wiring layer 22 exposed at the bottom of each through hole 31. The dry desmearing process is one type of a plasma process. The dry desmearing process may be performed, for example, through plasma etching that uses a gas mixture of carbon tetrafluoride (CF$_4$) and oxygen (O$_2$). The dry desmearing process finely etches the resin 32 (refer to FIG. 5B) on the surface of the insulation layer 30. As illustrated in FIG. 5B, the dry desmearing process is performed on the insulation layer 30 so that among the resin 32 and the fillers 33, the resin 32 is dominantly etched. As a result, at the surface of the insulation layer 30, the fillers 33 become exposed from the resin 32 and so that the resin 32 and the fillers 33 are arranged in a mixed state. In the present example, at the surface of the insulation layer 30, the fillers 33 project out of the surface of the resin 32. The surface roughness of the resin 32 is lower than when the insulation layer 30 undergoes, for example, a wet desmearing process.

Then, in the step illustrated in FIG. 6A, the first metal film 51 of the CuNiTi alloy is formed to continuously cover the entire upper surface 30A of the insulation layer 30, the entire wall surface of each through hole 31, and the entire upper surface of the wiring layer 22 exposed at the bottom of each through hole 31. In the CuNiTi alloy, the content rate of Ni is set in the range of 5 wt % or greater and 30 wt % or less, and the content rate of Ti is set in the range of 5 wt % or greater and 15 wt % or less. This increases adhesion between the first metal film 51 and the insulation layer 30. In the example of FIG. 6B, the adhesion between the first metal film 51 and the resin 32 is increased, and the adhesion between the first metal film 51 and the fillers 33 is increased. Thus, the adhesion of the first metal film 51 to both the resin 32 and the fillers 33 is increased. Specifically, the peel strength of the first metal film 51 with respect to the insulation layer 30 is 0.5 kgf/cm or greater. This limits delamination of the first metal film 51 from the insulation layer 30.

The first metal film 51 may be formed through, for example, a sputtering process. Formation of the first metal film 51 through the sputtering process allows the content rates of Ni and Ti in the first metal film 51 of the CuNiTi alloy to be accurately set in the given range described above.

Figure 7:
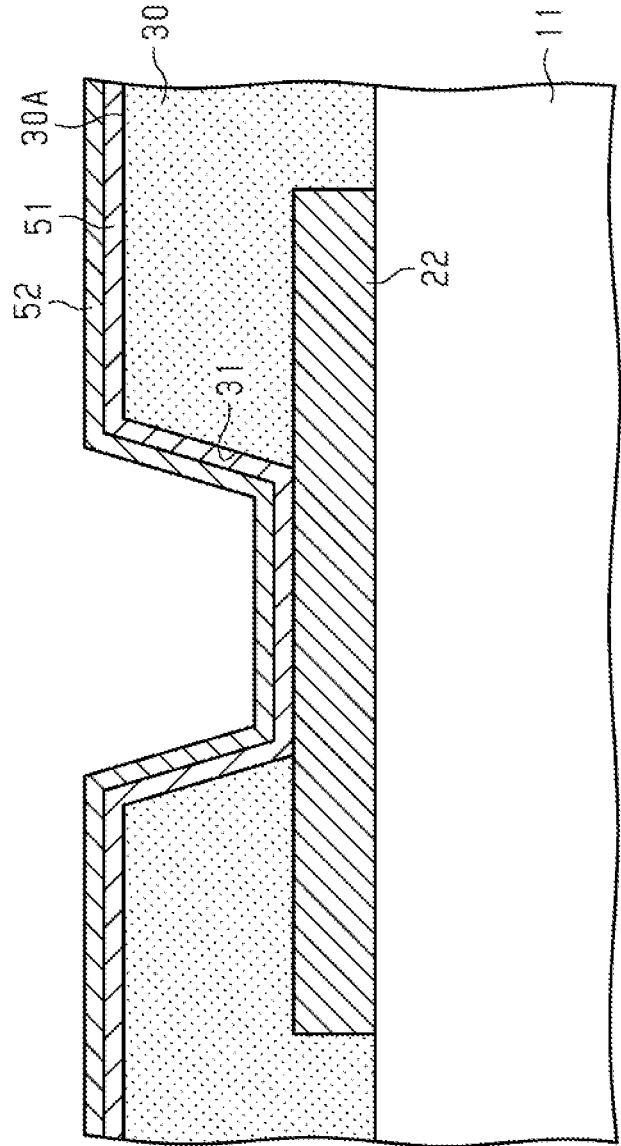

In the step illustrated in FIG. 7, the second metal film 52 is formed with Cu so as to cover the entire surface of the first metal film 51. The second metal film 52 may be formed through, for example, a sputtering process. Formation of the second metal film 52 through the sputtering process allows the second metal film 52 to be formed with the sputtering device used to form the first metal film 51.

Figure 8:
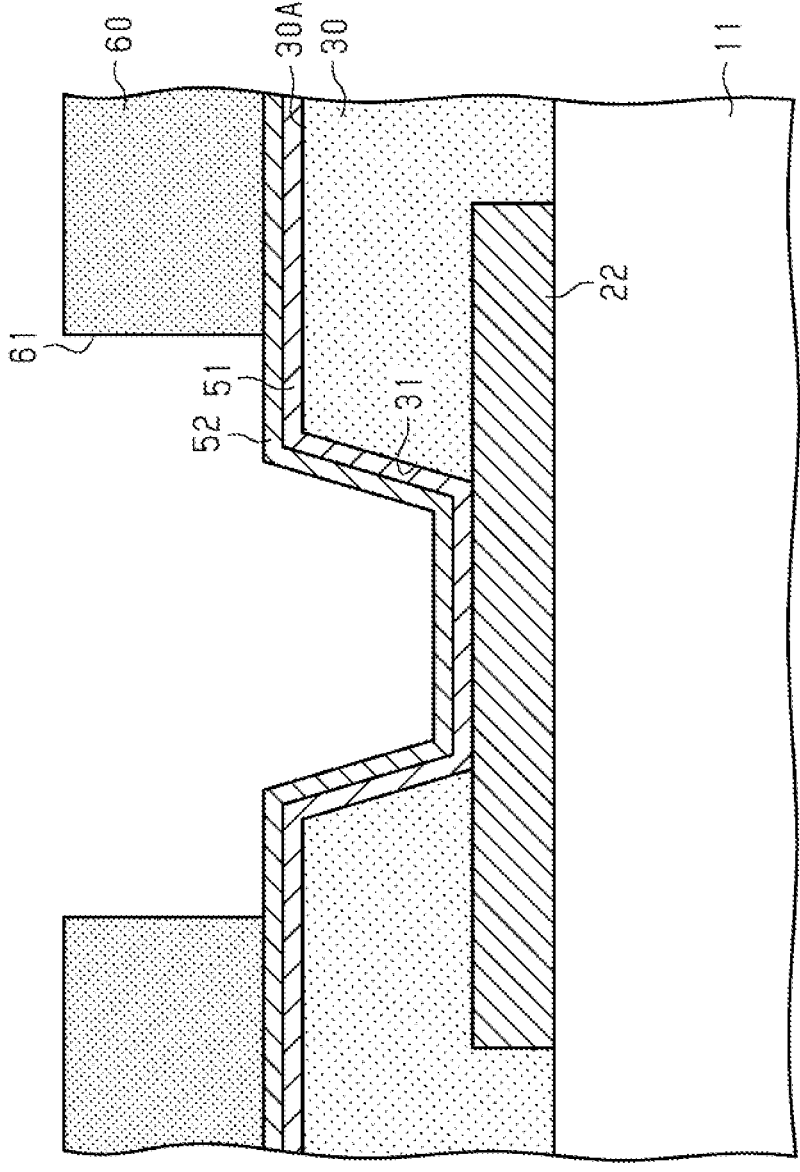

In the step illustrated in FIG. 8, a resist layer 60 including openings 61 is formed on the second metal film 52 that is formed on the upper surface 30A of the insulation layer 30. The openings 61 expose the second metal film 52 at parts corresponding to regions where the metal layer 54 illustrated in FIG. 2A are formed. The material of the resist layer 60 may be, for example, a material that resists plating in the electrolytic plating process performed in the following step. For example, the material of the resist layer 60 may be a photosensitive dry film resist or a liquid photoresist (e.g., dry film resist or liquid resist of novolac resin or acrylic resin). For example, when a photosensitive dry film resist is used, a dry film is laminated to the upper surface of the second metal film 52 through thermocompression bonding, and the dry film is patterned through photolithography to form the resist layer 60 including the openings 61. When using a liquid photoresist, the resist layer 60 may be performed through a similar process.

Figure 9:
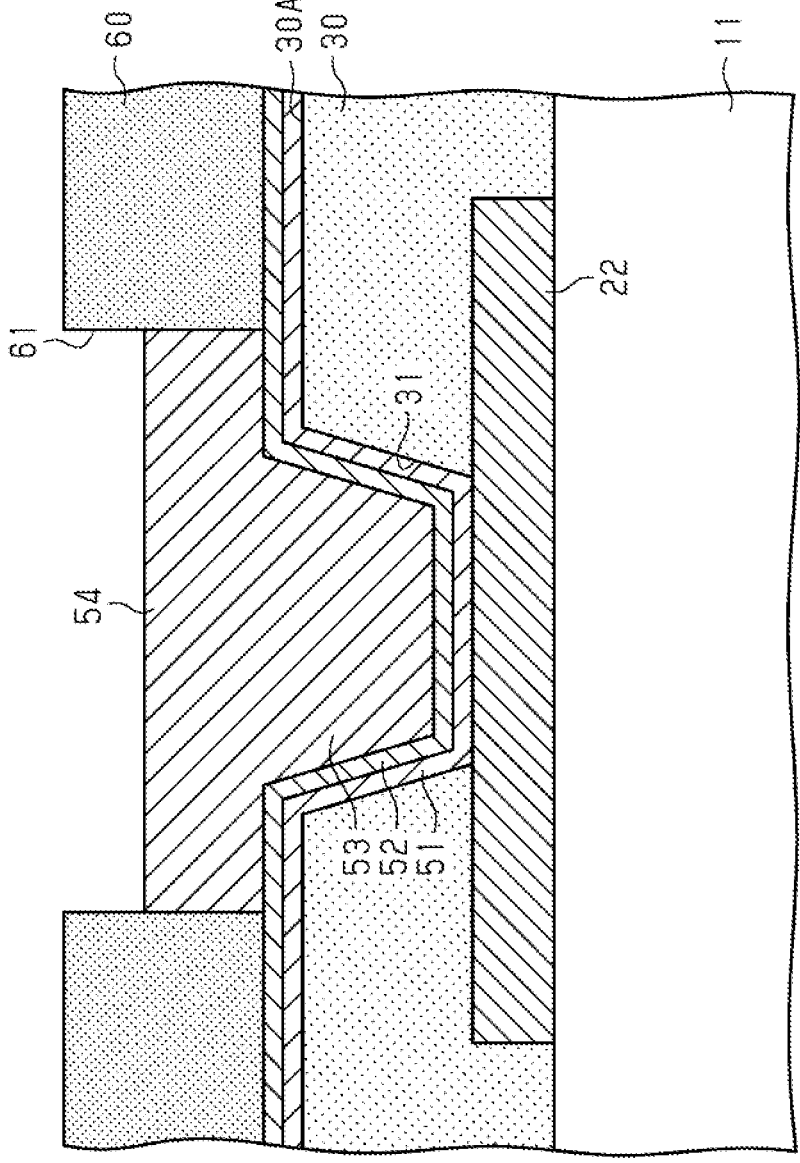

In the step illustrated in FIG. 9, an electrolytic plating process is performed on the second metal film 52 using the resist layer 60 as a plating mask and the second metal film 52 as a plating power feeding layer. In the present example, the electrolytic plating process is performed on the upper surface of the second metal film 52 that is exposed from the openings 61 of the resist layer 60. In this case an electrolytic Cu plating process is performed. This step forms the metal layer 53, which fills the through holes 31 at the inner side of the second metal film 52, and the metal layer 54 in the openings 61. The metal layer 54 is formed continuously and integrally with the metal layer 53.

Figure 10:
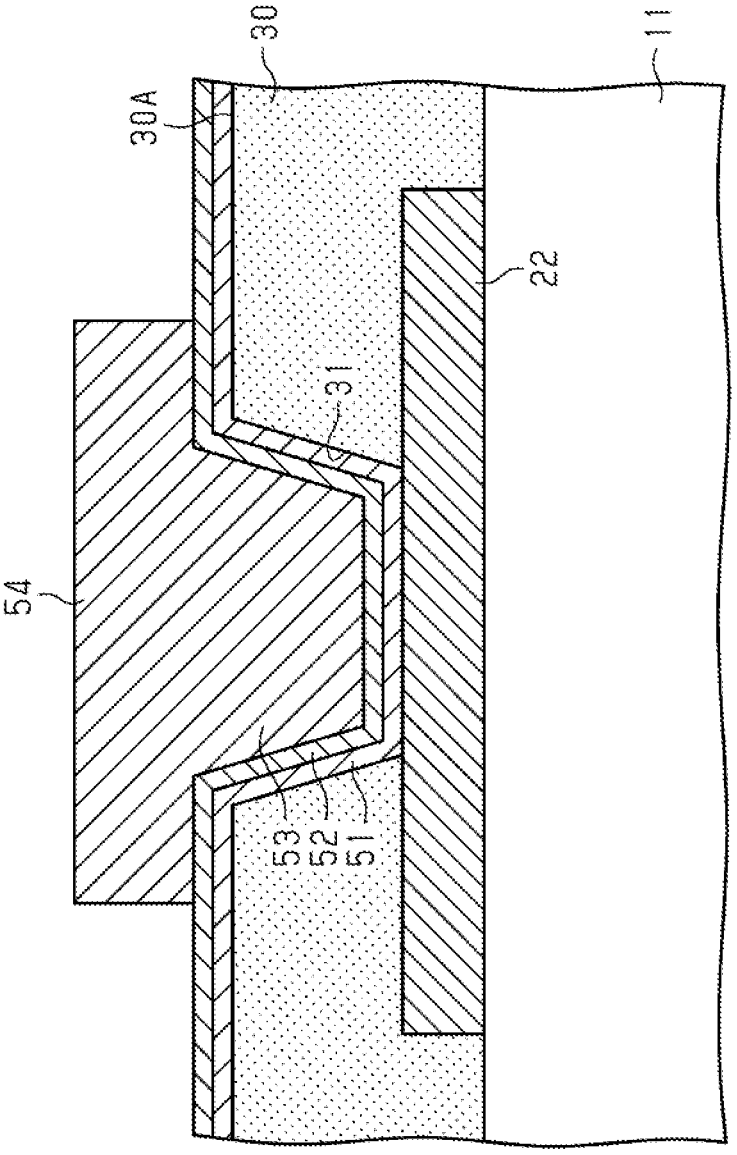

In the step illustrated in FIG. 10, the resist layer 60 of FIG. 9 is removed by an alkali delamination liquid (e.g., organic amine delamination liquid, caustic soda, acetone, or ethanol).

Figure 11:
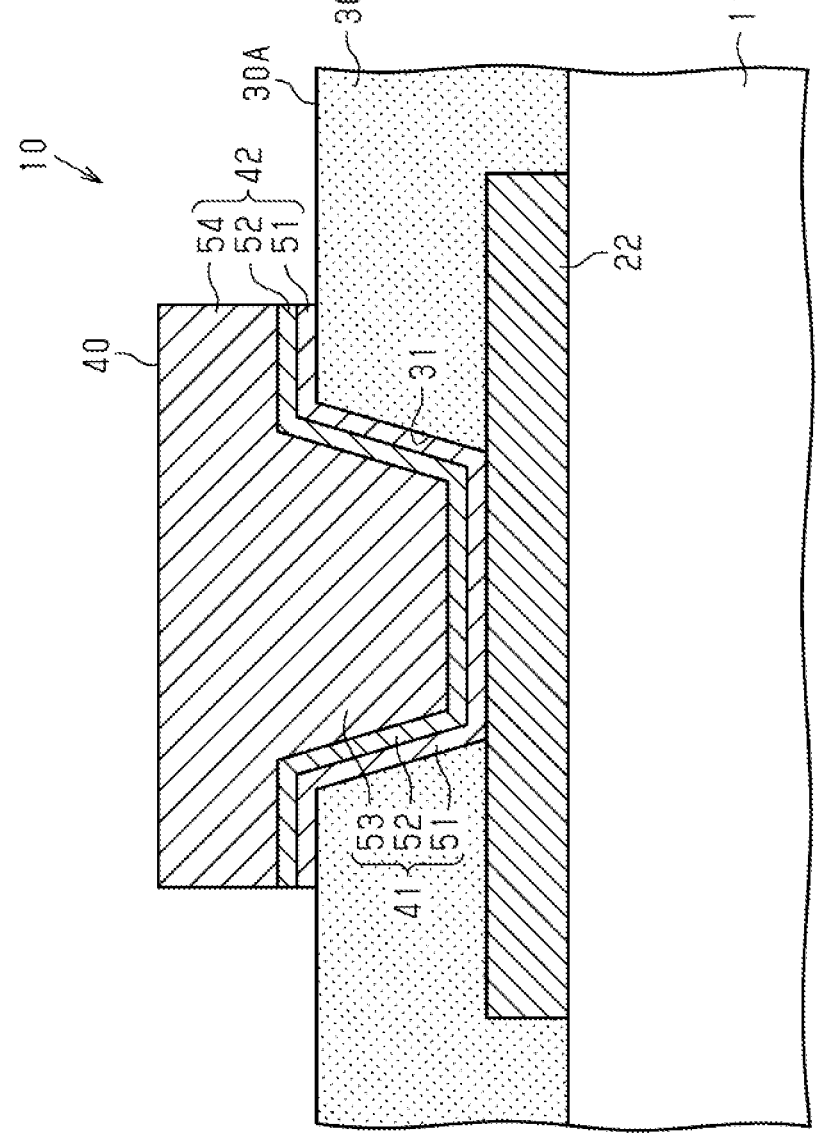

In the step illustrated in FIG. 11, etching is performed using the metal layer 54 as an etching mask to remove unnecessary parts of the second metal film 52 and unnecessary parts of the first metal film 51. When the first metal film 51 is a Cu film, for example, wet etching is performed using a Cu etching liquid (e.g., sulfuric acid-hydrogen peroxide-based aqueous solution) to remove unnecessary parts of the second metal film 52. In this case, when the content rates of Ni and Ti in the first metal film 51 are set in the given ranges described above, unnecessary parts of the first metal film 51 and unnecessary parts of the second metal film 52 may be removed simultaneously with the Cu etching liquid (e.g., a sulfuric acid-hydrogen peroxide-based aqueous solution). That is, the Cu etching liquid used to remove unnecessary parts of the second metal film 52 also removes unnecessary parts of the first metal film 51. Thus, there is no need to use separate etching liquids to remove unnecessary parts of the first metal film 51 and unnecessary parts of the second metal film 52. This keeps the manufacturing cost of the wiring substrate 10 relatively low.

The manufacturing steps described above form the via wiring 41 including the first metal film 51, the second metal film 52, and the metal layer 53 in the through holes 31. Further, the wiring pattern 42 including the first metal film 51, the second metal film 52, and the metal layer 54 is formed on the upper surface 30A of the insulation layer 30. The wiring layer 40 including the via wiring 41 and the wiring pattern 42 is formed on the wiring layer 22 that is exposed at the bottom of each through hole 31.

First Experiment

A first experiment that will now be described proves that when the content rates of Ni and Ti in the first metal film 51 are set in the given ranges described above, adhesion is increased between the first metal film 51 and the surface of the insulation layer 30 where the fillers 33 are exposed from the resin 32.

Experiment Conditions

Thirty evaluation samples were first prepared. Each sample was formed by performing a sputtering process to stack the first metal film 51 having a thickness of 30 nm and a Cu film having a thickness of 300 nm on the upper surface 30A of the insulation layer 30 where the fillers 33, which were silica fillers, were exposed from the resin 32, which was an epoxy resin. Then, an electrolytic Cu plating layer having a thickness of 35 μm was formed on the Cu film. The combination of the content rate of Ni and the content rate of Ti in the first metal film 51 was set differently in each of the samples. In this example, six Ni content rates were combined with five Ni content rates to produce samples of 30 (6×5) combinations. The six Ni content rates were 0 wt %, 5 wt %, 10 wt %, 20 wt %, 30 wt %, and 40 wt %. The five Ti content rates were 0 wt %, 5 wt %, 10 wt %, 15 wt %, and 20 wt %. Conditions other than the Ni content rate and the Ti content rate of the first metal film 51 were the same in every one of the samples.

Crosscut Test

After performing a reliability test, a crosscut test was conducted on each of the thirty samples to evaluate the adhesion of the first metal film 51 to the upper surface 30A of the insulation layer 30. The results are illustrated in FIG. 12. In the reliability test, each sample was arranged in an atmosphere in which the temperature was 125° C. for 24 hours. Then, each sample was arranged in an atmosphere in which the humidity was 60% RH and the temperature was 60° C. for 40 hours. Afterwards, a reflow process was performed on each sample at 265° C. In the crosscut test, an electrolytic Cu plating layer was cut into squares with each side having a length of 1 mm to form a grid-shaped pattern of 100 sections. An adhesive tape was applied to the surface of the electrolytic Cu plating layer in each of the 100 sections. Then, the adhesive tape was removed. Delamination of the first metal film 51 when removing the adhesive test was checked to evaluate adhesion of the first metal film 51 to the upper surface 30A of the insulation layer 30. If delamination of the first metal film 51 did not occur when removing the adhesive tape, adhesion of the first metal film 51 to the upper surface 30A of the insulation layer 30 was determined to be satisfactory. Such an experiment result is marked with a circle in FIG. 12. If delamination of the first metal film 51 occurred when removing the adhesive tape, adhesion of the first metal film 51 to the upper surface 30A of the insulation layer 30 was determined to be unsatisfactory. Such an experiment result is marked with a cross in FIG. 12.

First Experiment Result

As apparent from FIG. 12, the adhesion of the first metal film 51 to the upper surface 30A of the insulation layer 30 was low when the content rate of Ti in the first metal film 51 was low. When the content rate of Ti in the first metal film 51 was 0 wt %, that is, when there was no Ti, the adhesion of the first metal film 51 to the upper surface 30A of the insulation layer 30 was low. Further, when the content rate of Ti in the first metal film 51 was 0 wt %, regardless of the content rate of Ni in the first metal film 51, the adhesion of the first metal film 51 to the upper surface 30A of the insulation layer 30 was low. Further, as apparent from FIG. 12, when the content rate of Ni in the first metal film 51 was low, the adhesion of the first metal film 51 to the upper surface 30A of the insulation layer 30 was low. When the content rate of Ni in the first metal film 51 was 0 wt %, that is, when there was no Ni, there were cases in which the adhesion of the first metal film 51 to the upper surface 30A of the insulation layer 30 was low. Further, when the content rate of Ni in the first metal film 51 was 0 wt % and the content rate of Ti in the first metal film 51 was less than 20 wt %, the adhesion of the first metal film 51 to the upper surface 30A of the insulation layer 30 was low.

When the content rate of Ni was 5 wt % or greater and 30 wt % or less and the content rate of Ti was 5 wt % or greater and 15 wt % or less (range in box indicated by bolded lines) in the first metal film 51, the adhesion of the first metal film 51 to the upper surface 30A of the insulation layer 30 was satisfactory. When the content rate of Ti in the first metal film 51 was 20 wt %, regardless of the content rate of Ni in the first metal film 51, the adhesion of the first metal film 51 to the upper surface 30A of the insulation layer 30 was satisfactory. Further, when the content rate of Ni was 40 wt % and the content rate of Ti was 5 wt % or greater in the first metal film 51, the adhesion of the first metal film 51 to the upper surface 30A of the insulation layer 30 was satisfactory.

Second Experiment

A second experiment that will now be described proves that when the content rates of Ni and Ti in the first metal film 51 are set in the given ranges described above, the first metal film 51 is removed with the Cu etching liquid in a preferred manner.

Etching Test

In the same manner as the first experiment, the combination of the content rate of Ni and the content rate of Ti in the first metal film 51 was set differently in thirty samples. An etching process was performed on each of the thirty samples using a Cu etching liquid, which was a sulfuric acid-hydrogen peroxide-based aqueous solution in this case. A microscope was used to check whether the first metal film 51 was etched and removed together with the Cu film in the etching process to evaluate the effectiveness of the etching removal of the first metal film 51 with the Cu etching liquid. The results are illustrated in FIG. 13. In a case where no residue of the first metal film 51 was observed with the microscope, it was determined that the first metal film 51 was effectively etched and removed with the Cu etching liquid. Such an experiment result is marked with a circle in FIG. 13. In a case where residues of the first metal film 51 were observed with the microscope, it was determined that the first metal film 51 could not be effectively etched and removed with the Cu etching liquid. Such an experiment result is marked with a cross in FIG. 13.

Second Experiment Result

As apparent from FIG. 13, when the content rate of Ti in the first metal film 51 was high, the first metal film 51 could not be effectively etched and removed with the Cu etching liquid. Further, when the content rate of Ti in the first metal film 51 was 20 wt % or greater, regardless of the content rate of Ni in the first metal film 51, the first metal film 51 could not be effectively etched and removed with the Cu etching liquid. Further, as apparent from FIG. 13, when the content rate of Ni in the first metal film 51 was high, the first metal film 51 could not be effectively etched and removed with the Cu etching liquid. When the content rate of Ni in the first metal film 51 was 40 wt % or greater, there were cases in which the first metal film 51 could not be effectively etched and removed with the Cu etching liquid. Further, when the content rate of Ni in the first metal film 51 was 40 wt % and the content rate of Ti in the first metal film 51 was 5 wt % or greater, the first metal film 51 could not be effectively etched and removed with the Cu etching liquid.

When the content rate of Ni was 5 wt % of greater and 30 wt % or less and the content rate of Ti was 5 wt % or greater and 15 wt % or less (range in box indicated by bolded lines) in the first metal film 51, the first metal film 51 was effectively etched and removed with the Cu etching liquid. When the content rate of Ti in the first metal film 51 was 0 wt %, regardless of the content rate of Ni in the first metal film 51, the first metal film 51 was effectively etched and removed with the Cu etching liquid. Further, when the content rate of Ni was 0 wt % and the content rate of Ti was 15 wt % or less in the first metal film 51, the first metal film 51 was effectively etched and removed with the Cu etching liquid.

As apparent from the results of the first and second experiments described above, it is preferable that the content rate of Ni be 5 wt % or greater and 30 wt % or less and that the content rate of Ti be 5 wt % or greater and 15 wt % or less (range in box indicated by bolded lines) in the first metal film 51. That is, when the content rates of Ni and Ti in the first metal film 51 are set within the range described above (range in box indicated by bolded lines), satisfactory results may be obtained in both of the two experiments. It could be understood from the results of the two experiments that when the content rates of Ni and Ti in the first metal film 51 are set within the range described above, the adhesion of the first metal film 51 to the insulation layer 30 is increased, and the first metal film 51 is etched and removed adequately with the Cu etching liquid.

The present embodiment has the advantages described below.

(1) The wiring substrate 10 includes the wiring layer 22, the insulation layer 30, and the wiring layer 40. The insulation layer 30 covers the side surfaces of the wiring layer 22 and exposes parts of the upper surface of the wiring layer 22. The wiring layer 40 is formed on the wiring layer 22 exposed from the insulation layer 30. The insulation layer 30 includes the resin 32 and the fillers 33. The upper surface 30A of the insulation layer 30 is structured so that the fillers 33 are exposed from the resin 32. The wiring layer 40 includes the first metal film 51, which covers the upper surface 30A of the insulation layer 30 and the upper surface of the wiring layer 22 exposed from the insulation layer 30, and the metal layers 53 and 54 formed above the first metal film 51. The second metal film 52 is formed from Cu, and the first metal film 51 is formed from a CuNiTi alloy.

With this structure, the first metal film 51, which covers the upper surface 30A of the insulation layer 30 where the fillers 33 are exposed from the resin 32, is formed from the CuNiTi alloy containing Ti that has high adhesion to the fillers 33. Thus, even when the fillers 33 are exposed from the resin 32, the first metal film 51 is adequately adhered to the fillers 33. This allows the adhesion of the first metal film 51 to the upper surface 30A of the insulation layer 30, in which the resin 32 and the fillers 33 are arranged in a mixed state, to be higher than when the first metal film 51 is formed from an alloy that does not contain Ti. Consequently, the adhesion of the wiring layer 40, which includes the first metal film 51, to the insulation layer 30 is increased.

(2) The content rate of Ni in the first metal film 51 is set in the range of 5 wt % or greater and 30 wt % or less, and the content rate of Ti in the first metal film 51 is set in the range of 5 wt % or greater and 15 wt % or less. It could be understood from the results of the first and second experiments that when the content rates of Ni and Ti in the first metal film 51 are set within the range described above, the adhesion of the first metal film 51 to the insulation layer 30 is increased, and the first metal film 51 is etched and removed adequately with the Cu etching liquid. Thus, the first metal film 51 may be etched and removed with the Cu etching liquid that is relatively inexpensive. This allows the wiring substrate 10 to be manufactured without increasing manufacturing costs.

(3) When etching the second metal film 52, which is a Cu film, with the Cu etching liquid, the first metal film 51 is also etched and removed by the Cu etching liquid. Thus, there is no need to use separate etching liquids to remove unnecessary parts of the first metal film 51 and unnecessary parts of the second metal film 52. This allows the wiring substrate 10 to be manufactured without increasing manufacturing costs.

(4) The first metal film 51 is formed through a sputtering process. This allows the content rates of Ni and Ti in the first metal film 51, which is formed from the CuNiTi alloy, to be accurately set in the given range described above.

Other Embodiments

The above embodiment may be modified as described below. The above embodiment and the modified examples described below may be combined as long as there is no technical contradiction.

The structure of the wiring layer 40 in the above embodiment may be changed. For example, the second metal film 52 may be omitted. In this case, the metal layers 53 and 54 are formed on the first metal film 51.

In the above embodiment, the via wiring 41 is formed filling the through holes 31. Instead, for example, the via wiring 41 may be formed as a conformal via.

The structure of the wiring layer 22 in the above embodiment may be changed.

Figure 14B:
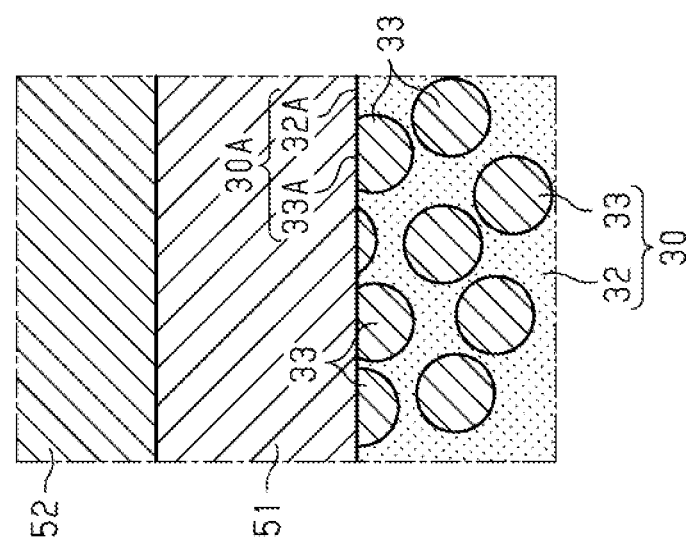
FIG. 14B is a further enlarged cross-sectional view of part of the wiring substrate illustrated in FIG. 14A.
Figure 14A:
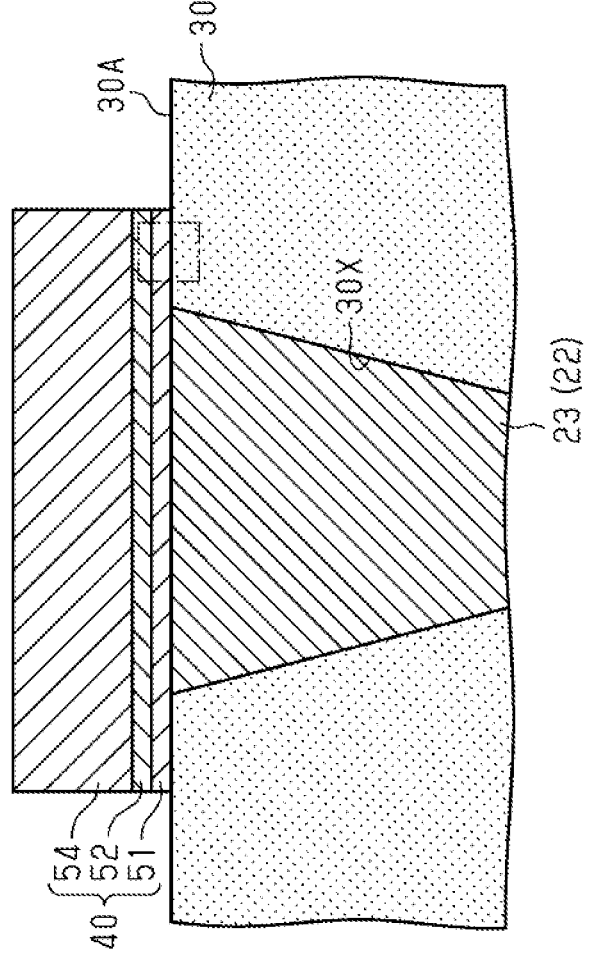
FIG. 14A is an enlarged cross-sectional of part of a modified example of the wiring substrate.

For example, as illustrated in FIG. 14A, the wiring layer 22 may be via wiring 23 that extends through the insulation layer 30 in the thickness-wise direction. In this modified example, the insulation layer 30 covers the side surfaces of the via wiring 23 and exposes the entire upper surface of the via wiring 23. In this modified example, the upper surface 30A of the insulation layer 30 is flush with the upper surface of the via wiring 23. In this modified example, the wiring layer 40 includes the first metal film 51, which continuously covers the upper surface 30A of the insulation layer 30 and the upper surface of the via wiring 23 exposed from the insulation layer 30, the second metal film 52, which covers the upper surface of the first metal film 51, and the metal layer 54, which covers the upper surface of the second metal film 52. In this modified example, as illustrated in FIG. 14B, the first metal film 51 covers the upper surface 30A of the insulation layer 30 where the fillers 33 are exposed from resin 32 in an adhered state.

In the modified example illustrated in FIG. 14A, a metal film having the same functionality as the first metal film 51 and the second metal film 52 may also be formed on a wall surface of a through hole 30X that extends through the insulation layer 30 in the thickness-wise direction.

The upper surface 30A of the insulation layer 30 in the above embodiment does not have to be structured so that parts of the fillers 33 project upward out of the upper surface 32A of the resin 32.

For example, as shown in FIG. 14B, at the upper surface 30A of the insulation layer 30, the upper surface 32A of the resin 32 may be flush with upper surfaces 33A of the fillers 33. In this case, the upper surfaces 33A of the fillers 33 exposed from the resin 32 are not spherical. The upper surfaces 33A are flat and extend in a planar direction orthogonal to the thickness-wise direction of the insulation layer 30. In this modified example, the upper surface 30A of the insulation layer 30 is formed by, for example, polishing the upper surface 30A of the insulation layer 30. The upper surface 30A of the insulation layer 30 may be polished through, for example, chemical mechanical polishing (CMP), machine polishing, or the like. Such polishing simultaneously polishes the resin 32 and the fillers 33 so that the upper surface 32A of the resin 32 becomes a polished surface, and the upper surfaces 33A of the fillers 33 become polished surfaces. Such polishing is performed before forming the first metal film 51. In the example illustrated in FIG. 14A, the upper surface 30A of the insulation layer 30 is polished together with the upper surface of the via wiring 23.

In this modified example, the first metal film 51 covers the upper surface 32A of the resin 32 and the upper surfaces 33A of the fillers 33, which are exposed from the upper surface 32A of the resin 32. In this modified example, the first metal film 51 covers the upper surface 32A of the resin 32 in an adhered state and covers the upper surfaces 33A of the fillers 33 in an adhered state.

In the above embodiment, the resin 32 included in the insulation layer 30 does not have to be an epoxy resin. For example, the resin 32 may be a resin other than an epoxy resin. For example, the resin 32 may be changed to a polyimide resin.

In the above embodiment, the fillers 33 included in the insulation layer 30 do not have to be silica fillers. For example, the fillers 33 may be fillers other than silica fillers. For example, the fillers 33 may be alumina fillers.

In the above embodiment, the first metal film 51 does not have to be formed from the CuNiTi alloy, which is an alloy of Cu, Ni, and Ti. For example, Ti may be replaced by a metal having higher adhesion to the fillers 33 than Cu. For example, chromium (Cr) may be used instead of Ti, and the first metal film 51 may be formed by an alloy of Cu, Ni, and Cr.

In the above embodiment, the first metal film 51 is formed through a sputtering process but instead may be formed through, a vapor deposition process or an electroless plating process.

In the above embodiment, the second metal film 52 is formed through a sputtering process but instead may be formed through, a vapor deposition process or an electroless plating process.

In the above embodiment, the wiring layer 40 is formed through a semi-additive process but instead may be formed through any of other wiring formation processes such as a subtractive process.

In the above embodiment, the wiring layer 40 does not have to be the outermost wiring layer of the wiring substrate 10.

Figure 15:
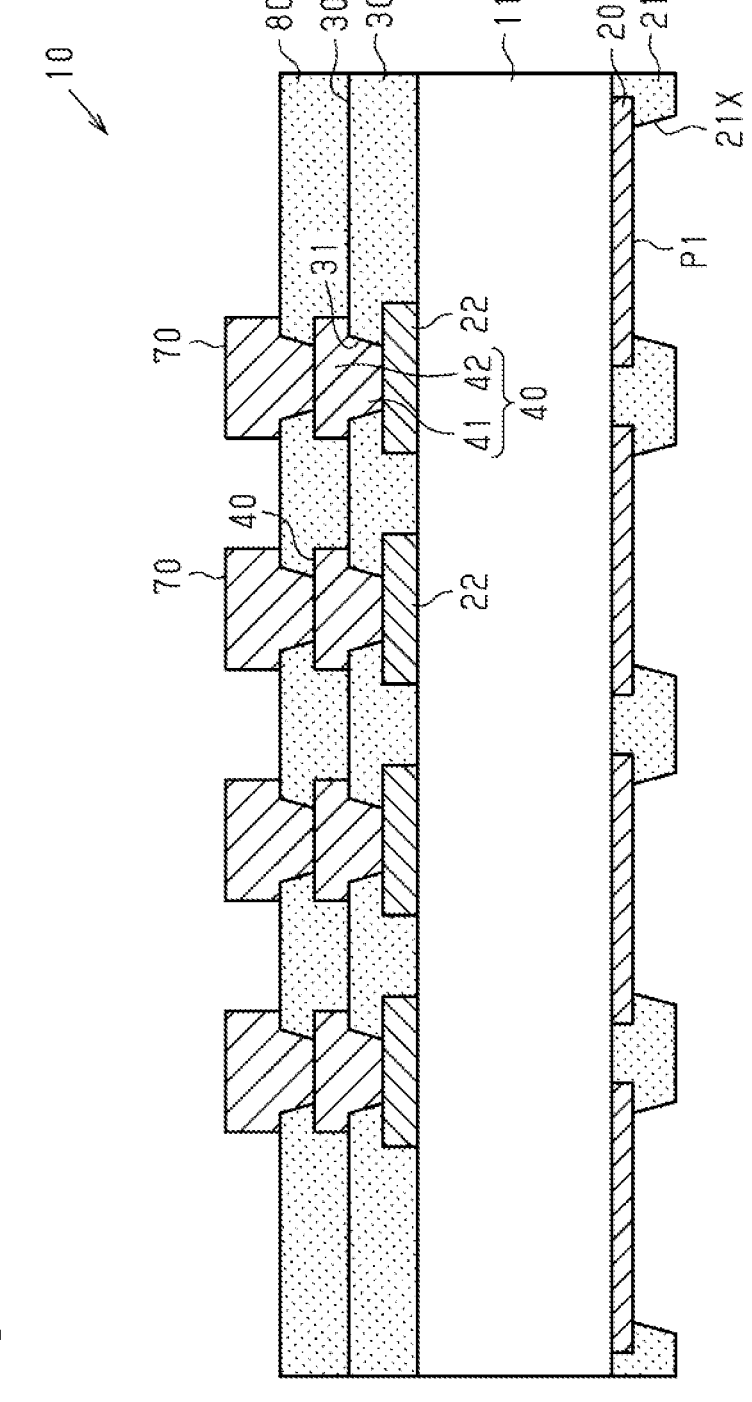
FIG. 15 is a schematic cross-sectional view illustrating another modified example of the wiring substrate.

For example, as illustrated in FIG. 15, the wiring layer 40 may be located inward from an outermost wiring layer 70. In this modified example, the wiring layer 40 is located between the outermost wiring layer 70 and the wiring layer 22.

In the wiring substrate 10 of this modified example, an insulation layer 80 that covers the wiring layer 40 is stacked on the upper surface 30A of the insulation layer 30. In the same manner as the insulation layer 30, the insulation layer 80 may include the resin 32 and the fillers 33 (refer to FIG. 2B). The outermost wiring layer 70 is formed on the upper surface of the insulation layer 80. The wiring layer 70 has the same structure as the wiring layer 40. That is, the wiring layer 70 may include the first metal film 51, the second metal film 52, and the metal layers 53 and 54 (refer to FIG. 2A).

In the wiring substrate 10 of the above embodiment, the second metal film 52 may be omitted from the wiring layer 40. For example, as illustrated in FIGS. 16A and 16B, the wiring layer 40 may be formed by the first metal film 51 and the metal layers 53 and 54 formed above the first metal film 51. In this modified example, the metal layers 53 and 54 are formed directly on the first metal film 51. The via wiring 41 is formed by the first metal film 51 and the metal layer 53, and the wiring patter 42 is formed by the first metal film 51 and the metal layer 54.

In the wiring substrate 10 of the above embodiment, the wiring layers 20, 22, 40 and the insulation layer 30 may be changed in quantity and layout.

Clauses

This disclosure further encompasses the following embodiments.

1. A method for manufacturing a wiring substrate, the method including:

forming an insulation layer that includes a resin and a filler, covers a side surface of a first wiring layer, and exposes at least part of an upper surface of the first wiring layer;

structuring an upper surface of the insulation layer so that the filler is exposed from the resin;

forming a first metal film of a CuNiTi alloy that covers the upper surface of the insulation layer and the upper surface of the first wiring layer that is exposed from the insulation layer;

forming a second metal film of Cu that covers a surface of the first metal film;

forming a metal layer on the second metal film; and simultaneously removing the first metal film and the second metal film at portions that do not overlap the metal layer in plan view through etching using the metal layer as a mask, in which a content rate of Ni in the first metal film is 5 wt % or greater and 30 wt % or less, and a content rate of Ti in the first metal film is 5 wt % or greater and 15 wt % or less.

2. The method according to clause 1, in which the forming an insulation layer includes forming a through hole that extends through the insulation layer in a thickness-wise direction and exposes part of the upper surface of the first wiring layer by performing laser drilling, and the structuring an upper surface of the insulation layer so that the filler is exposed from the resin includes performing a dry desmearing process on the insulation layer after the through hole is formed.

3. The method according to clause 1, in which the structuring an upper surface of the insulation layer so that the filler is exposed from the resin includes polishing the upper surface of the insulation layer so that the filler is exposed from the resin.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A wiring substrate, comprising:

a first wiring layer;

an insulation layer covering a side surface of the first wiring layer and exposing at least part of an upper surface of the first wiring layer; and a second wiring layer formed on the first wiring layer that is exposed from the insulation layer, wherein the insulation layer includes a resin and a filler, the insulation layer includes an upper surface having a structure in which the filler is exposed from the resin, the second wiring layer includes a first metal film and a metal layer, the first metal film covering the upper surface of the insulation layer and the upper surface of the first wiring layer that is exposed from the insulation layer, and the metal layer being formed above the first metal film, the first metal film is formed from a CuNiTi alloy, a content rate of Ni in the first metal film is 5 wt % or greater and 30 wt % or less, and a content rate of Ti in the first metal film is 5 wt % or greater and 15 wt % or less.

2. The wiring substrate according to claim 1, wherein the second wiring layer includes the first metal film, a second metal film covering a surface of the first metal film, and the metal layer formed on the second metal film, and the second metal film is formed from Cu.

3. The wiring substrate according to claim 1, wherein the upper surface of the insulation layer is structured so that part of the filler projects upward out of an upper surface of the resin.

4. The wiring substrate according to claim 3, wherein the filler is spherical, and the upper surface of the insulation layer is structured so that part of a spherical surface of the filler projects upward out of the upper surface of the resin.

5. The wiring substrate according to claim 1, wherein the upper surface of the insulation layer is structured so that an upper surface of the resin is flush with an upper surface of the filler.

6. The wiring substrate according to claim 1, wherein the insulation layer includes a through hole extending through the insulation layer in a thickness-wise direction and exposing part of the upper surface of the first wiring layer, and the first metal film continuously covers the upper surface of the insulation layer, a wall surface of the through hole, and the upper surface of the first wiring layer that is exposed from the through hole.

7. The wiring substrate according to claim 1, wherein the first wiring layer is via wiring that fills a through hole extending through the insulation layer in a thickness-wise direction, and the first metal film covers the upper surface of the insulation layer and an upper surface of the via wiring exposed from the through hole.

8. The wiring substrate according to claim 1, wherein the resin is epoxy resin, and the filler is silica filler.

9. The wiring substrate according to claim 1, wherein the first metal film has a thickness that is greater than or equal to 30 nm and less than or equal to 100 nm.

* * * * *